United States Patent [19]

Guillemaud et al.

[11] Patent Number: 5,270,973
[45] Date of Patent: Dec. 14, 1993

[54] VIDEO RANDOM ACCESS MEMORY HAVING A SPLIT REGISTER AND A MULTIPLEXER

[75] Inventors: Andre J. Guillemaud, Sugar Land; Anthony M. Balistreri, Houston; Karl M. Guttag, Missouri City, all of Tex.; Richard D. Simpson, Bedford, Great Britain

[73] Assignee: Texas Instruments Incorporated, Dallas, Tex.

[21] Appl. No.: 563,471

[22] Filed: Aug. 6, 1990

[51] Int. Cl.⁵ ............................................. G11C 7/00
[52] U.S. Cl. .................... 365/189.02; 365/189.05; 365/240
[58] Field of Search ............... 365/189.02, 189.12, 365/230.02, 189.05, 239, 240, 233

[56] References Cited

U.S. PATENT DOCUMENTS

| | | | |
|---|---|---|---|
| 4,281,401 | 7/1981 | Redwine et al. | 365/222 |
| 4,639,890 | 1/1987 | Heilveil et al. | 364/900 |
| 4,694,431 | 9/1987 | Miyamura et al. | 365/189.02 |
| 4,747,081 | 5/1988 | Heilveil et al. | 365/219 |
| 4,825,411 | 4/1989 | Hamano | 365/189.04 |
| 4,852,061 | 7/1989 | Baron et al. | 365/189.02 X |
| 5,001,672 | 3/1991 | Ebbers et al. | 365/230.05 |

*Primary Examiner*—Joseph A. Popek
*Attorney, Agent, or Firm*—Richard B. Havill; Leo N. Heiting; Richard L. Donaldson

[57] ABSTRACT

A video random access memory includes memory cells arranged in rows and columns. The columns of memory cells are divided into first and second portions, and the cells of each row of the first portion of memory are interleaved by address with the cells of the same row of the second portion of memory. A first half of a serial register includes a plurality of storage elements that are interleaved by address with a plurality of storage elements of a second half of the serial register. Between the first and second portions of the memory cells, column leads and a multiplexer selectively couple data from either the first portion or the second portion of the columns of the memory cells to either the first half or the second half of the serial register.

10 Claims, 8 Drawing Sheets

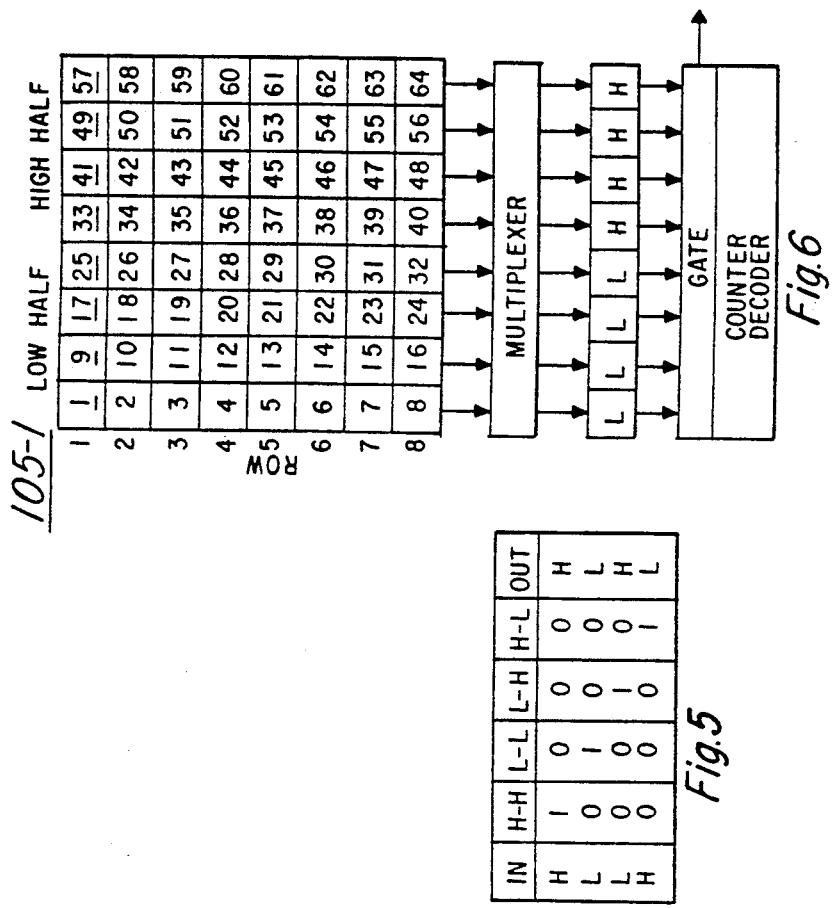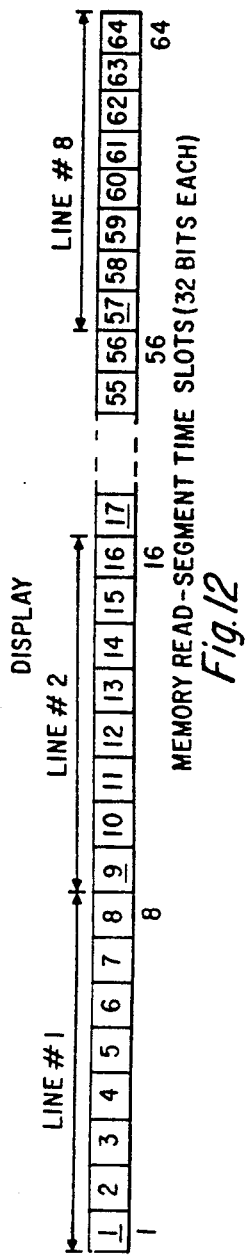

| MEMORY READ TIME SLOTS | SPLIT SERIAL REGISTER | | MULTIPLEXER RAM REGISTER |
|---|---|---|---|
| | LOW HALF | HIGH HALF | |
| 1  | ①  9  17  25 |              | L → L |
| 2  |              | ②  10  18  26 | L → H |
| 3  | ③  11  19  27 |              | L → L |
| 4  |              | ④  12  20  28 | L → H |
| 5  | ⑤  13  21  29 |              | L → L |
| 6  |              | ⑥  14  22  30 | L → H |
| 7  | ⑦  15  23  31 |              | L → L |
| 8  |              | ⑧  16  24  32 | L → H |
| 9  | 1  ⑨  17  25 |              | L → L |
| 10 |              | 2  ⑩  18  26 | L → H |
| 11 | 3  ⑪  19  27 |              | L → L |
| 12 |              | 4  ⑫  20  28 | L → H |
| 13 | 5  ⑬  21  29 |              | L → L |
| 14 |              | 6  ⑭  22  30 | L → H |
| 15 | 7  ⑮  23  31 |              | L → L |
| 16 |              | 8  ⑯  24  32 | L → H |
| 17 | 1  9  ⑰  25 |              | L → L |
| ⋮  | ⋮            | ⋮            | ⋮ |
| 55 | 39  47  ㊽  63 |              | H → L |
| 56 |              | 40  48  ㊻  64 | H → H |
| 57 | 33  41  49  ㊼ |              | H → L |
| 58 |              | 34  42  50  ㊽ | H → H |
| 59 | 35  43  51  ㊾ |              | H → L |
| 60 |              | 36  44  52  ㊿ | H → H |
| 61 | 37  45  53  ㊶ |              | H → L |
| 62 |              | 38  46  54  ㊷ | H → H |
| 63 | 39  47  55  ㊳ |              | H → L |
| 64 |              | 40  48  56  ㊴ | H → H |

Fig.7

VIDEO RANDOM ACCESS MEMORY HAVING A SPLIT REGISTER AND A MULTIPLEXER

This application contains subject matter disclosed in copending applications Ser. No. 387,569, filed Jul. 28, 1989, Ser. No. 563,472, filed concurrently herewith, Ser. No. 563,469, filed concurrently herewith, and in U.S. Pat. Nos. 4,281,401, 4,639,890, and 4,747,081. The above mentioned applications and patents are incorporated herein by reference.

BACKGROUND OF THE INVENTION

1. Field of the Invention

This invention relates to a graphics display system which may be more particularly described as a graphics display system having a random access memory with a split serial register arrangement.

2. Description of Related Art

In a typical random access memory, the time required for accessing a row is approximately twice as long as the time required for accessing a column. For speedy overall operation, it is desirable to access a row and hold it while several of the columns are accessed along that row. This is referred to as "page model" operation. If all of the columns across the array are accessed during a single row access, time saved may be as much as 50 percent–70 percent. Such time saving may be achieved during memory write or during memory read operations. For any specific system design there may be trade-offs between memory write time and memory read time to achieve operating efficiency.

For computer graphics system applications, further trade-offs can be made between memory read and write times and the capability and speed of a processor used for generating the data to be presented on a video screen. Other factors to be considered include the width and height of the display, the size of the video random access memory and whether the system is line oriented or tile oriented. Final choices among the several trade-offs is a matter left for the system designer or user.

Suppliers of devices which may be used in such applications prefer to manufacture devices that include several optional features so that designers and users will apply each type of device in many different applications. This enables one device design effort to result in large manufacturing runs and low costs per device.

In furtherance of the just mentioned design strategy, integrated circuit manufacturers have been improving the designs of video random access memory integrated circuit devices by adding features which increase the flexibility and speed of operation of those devices. Some of the features which have been added to random access memory designs include the addition of split serial registers to improve access to and from the memory array and selectable taps for readout from the split serial registers. These features enable the user to closely pack data into the video random access memory and to thereby avoid wasting memory space.

As previously mentioned, there are two modes of operation, i.e., line oriented and tile oriented. In line oriented operation, the graphics microprocessor generates and stores data in sequential order as it will appear line-byline on the display. Storage of data in the video random access memory and read out from storage to the display are accomplished in serial order bit-by-bit and line-by-line. Read out from the split serial register to the display is timed to correlate with the display sweep signal. Prior video random access memory device designs have features which are very desirable and are in widespread use in line oriented systems.

Prior video random access memory device designs are much less flexible and useful with respect to tile oriented systems. Typically, a tile oriented display is divided into a grid of equal size and shape areas, called tiles. The size and shape of the tiles are other factors among all of the factors to be balanced by the system designer or user. For instance, the tiles may be squares or rectangles. If rectangles, they may be oriented with the long dimension either laying horizontally or balanced by the system designer or user. For instance, the tiles may be squares or rectangles. If rectangles, they may be oriented with the long dimension either laying horizontally or standing vertically. For some tile sizes and orientations, currently available video random access memory devices lack sufficient flexibility for efficient use in some possible system applications. The layout of prior art devices can result in memory devices which are so complex that they are too costly for commercial manufacture and use.

SUMMARY OF THE INVENTION

The foregoing problems are solved by a video random access memory wherein the memory cells are arranged in rows and columns and a serial register is used for accessing the memory cells. The columns of memory cells are divided into first and second portions, and the first portion of memory cells of each row are interleaved by addresses with the second portion of memory cells of the same row. A first part of the serial register includes a plurality of storage elements that are interleaved by addresses with a plurality of storage elements of a second part of the serial register. From the first and second portions of the memory cells, column leads and a multiplexer selectively couple data from either the first portion or the second portion of the columns of the memory cells to either the first part or the second part of the serial register.

It is an advance in the art of processing video display data from the random access memory to either of the two parts to selectively transfer stored data of the serial register. Such an arrangement enhances the flexibility of the random access memory to accommodate many different tile sizes and shapes while operating efficiently.

It is a further advance in the design of a random access memory with the serial register, to interleave by address the memory cells of the array and to interleave by address the storage elements of the parts of the split serial register. Such interleaving greatly reduces lead complexity to a multiplexer in the memory system so that the system can be fabricated as a single solid state integrated circuit.

BRIEF DESCRIPTION OF THE DRAWINGS

These and other advantages and features of the invention may be better understood by reading the following detailed description of an exemplary embodiment thereof with reference to the accompanying drawing wherein:

FIG. 5 is a truth table for defining the operation of the multiplexer of FIG. 3;

FIG. 6 is a map showing where tile data may be stored in the memory array for defining a screen of information in an exemplary tile oriented system operation;

FIG. 7 is a table showing a sequence for transferring data from the memory cells of the random access memory array and storing it in the storage elements of the split serial register;

FIG. 12 is a time line showing a sequence for moving data from the split serial register to the display; and FIG. 13 is a map showing where tile information is presented on a display screen.

DETAILED DESCRIPTION

Figure 1:
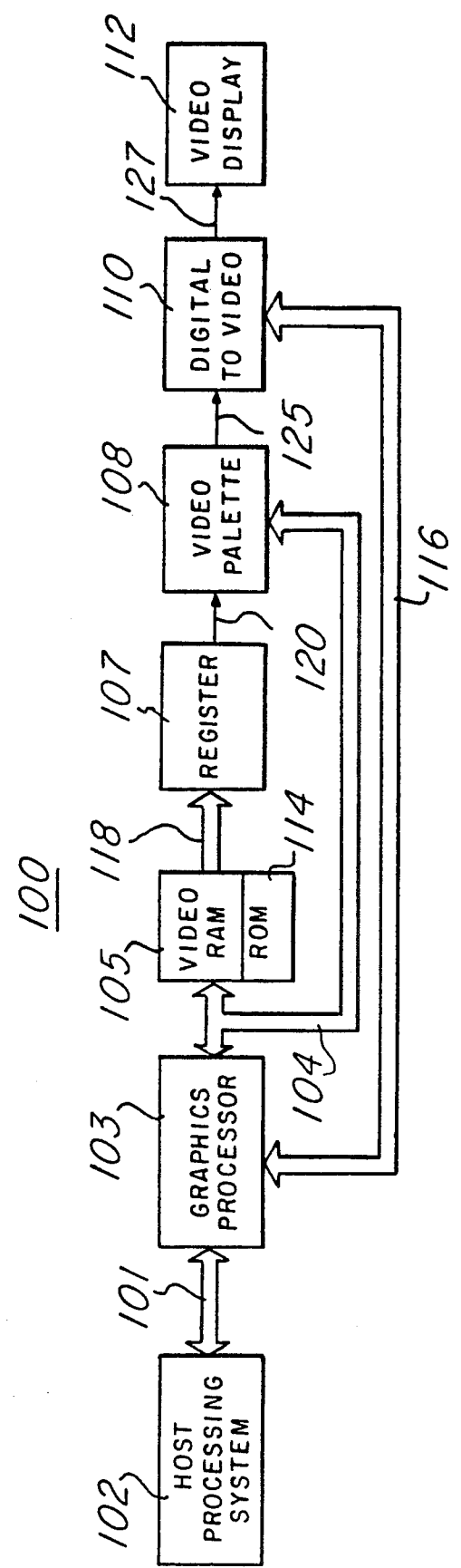
FIG. 1 is a block diagram of a graphics display system.

Referring now to FIG. 1, there is shown a block diagram of a data processing system 100 including a graphics display arrangement for presenting information. A more complete description of the arrangement and operation of the system of FIG. 1 can be found in a patent application Ser. No. 821,641, filed Jan. 23, 1986, which is incorporated herein by reference.

The data processing system 100 includes a host processing system 102, a graphics processor 103, such as a Texas Instruments TMS34010 or THS34020 Graphics System Processor, a video random access memory 105, a data register 107, a video palette 108, a digital to video converter 110, and a video display 112.

Host processing system 102 provides the major computational capacity for the data processing system 100. Included in the host processing system 102 are a processor, an input device, a long term storage device, a read only memory, a random access memory and assorted peripheral devices that form a computer system. Arrangement and operation of the host processing system are considered to be conventional. As a result of its processing functions, the host processing system 102 determines the information content of the graphic display to be presented on a screen for the user.

Graphics processor 103 provides the major portion of data manipulation for producing the particular graphics display to be presented on the screen. The graphics processor 103 is bi-directionally coupled to the host processing system 102 by way of a host bus 101. In the arrangement of FIG. 1, graphics processor 103 operates independently from the host processing system 102. The graphics processor 103, however, is responsive to requests from the host processing system 102. Graphics processor 103 also communicates with memory 105 and the video palette 108 by way of a memory bus 104. Data to be stored in the video random access memory 105 is controlled by the graphics processor 103. The graphics processor, in turn, may be controlled either in part or wholly by a program stored in the video random access memory 105 or in a read only memory 114. Read only memory 114 may store various types of graphic image data.

Additionally the graphics processor 103 controls data stored within the video palette 108 and by way of a video control bus 116 the operation of the digital to video converter 110. Through the digital to video converter, the graphics processor 103 can control the line length and the number of lines per frame of the video graphic image. Significantly, the graphics processor 103 determines and controls where graphic display information is stored in the video random access memory 105. Subsequently, during readout from the video random access memory 105, the graphics processor determines the readout sequence from the video random access memory and the split serial register 107, the addresses to be accessed, and control information required to produce the desired graphic image on the display 112.

Video random access memory 105 stores the bit mapped graphics data which define the graphics image to be presented to the user. Control of the transfer of the data from the video random access memory 105 through the data register 107, the video palette 108, and the digital to video converter 110 to the display 112 is provided by the graphics processor 103. Video data output from the video random access memory 105 is transferred by way of a video output bus 118 to the data register 107 where it is assembled into a display bit stream. The data register 107 may be a shift register.

Storage elements of the data register 107 may be fabricated of either dynamic or static electronic circuits. Alternative choices of storage elements include any bistable electronic, magnetic, optical, or optoelectronic device with sufficient operating speed.

In accordance with a typical arrangement of the video random access memory 105, there is a bank of several separate random access memory integrated circuits. Storage cells of the video random access memory 105 may be fabricated as either dynamic or static electronic circuits. For a single readout access operation, only one bit of data is readout from a selected storage element of each of the integrated circuits. Thus a group of bits, including one bit from each of the several separate integrated circuits, are read out at once. The data register 107 assembles the display bit stream for transmission by way of a lead 120 to the video palette 108. Although the foregoing describes the video random access memory 105 as an electronic circuit, the invention may also be carried out by a memory fabricated as any bistable electronic, magnetic, optical or optoelectronic device with sufficient speed.

Under control of information from the graphics processor 103, the video palette 108, such as a Texas Instruments THS34070 Video Palette, converts the data received from the data register 107 into video level signals on a bus 125. This conversion is accomplished through a look-up table. The video level signal output from the video palette 108 may include color, saturation, and brightness information.

Digital to video converter 110 receives the digital video signals from the video palette 108 and, under control of signals received by way of the video control bus 116, converts the digital video signals into analog levels which are applied to the video display 112 via an output line 127. The number of pixels per horizontal line and the number of lines per display are determined by the graphics processor 103. Also, the synchronization, retrace, and blanking signals are controlled by the graphics processor 103. Altogether, this group of signals specify the desired video output to the video display 112.

Video display 112 produces the specified video image for viewing by the user. There are two techniques which are used widely. The first technique specifies video data in terms of color, hue, brightness, and saturation for each pixel. For the second technique, color levels of red, blue and green are specified for each pixel. The video palette 108, the digital to video converter 110, and the video display are designed and fabricated to be compatible with the selected technique.

Figure 2:
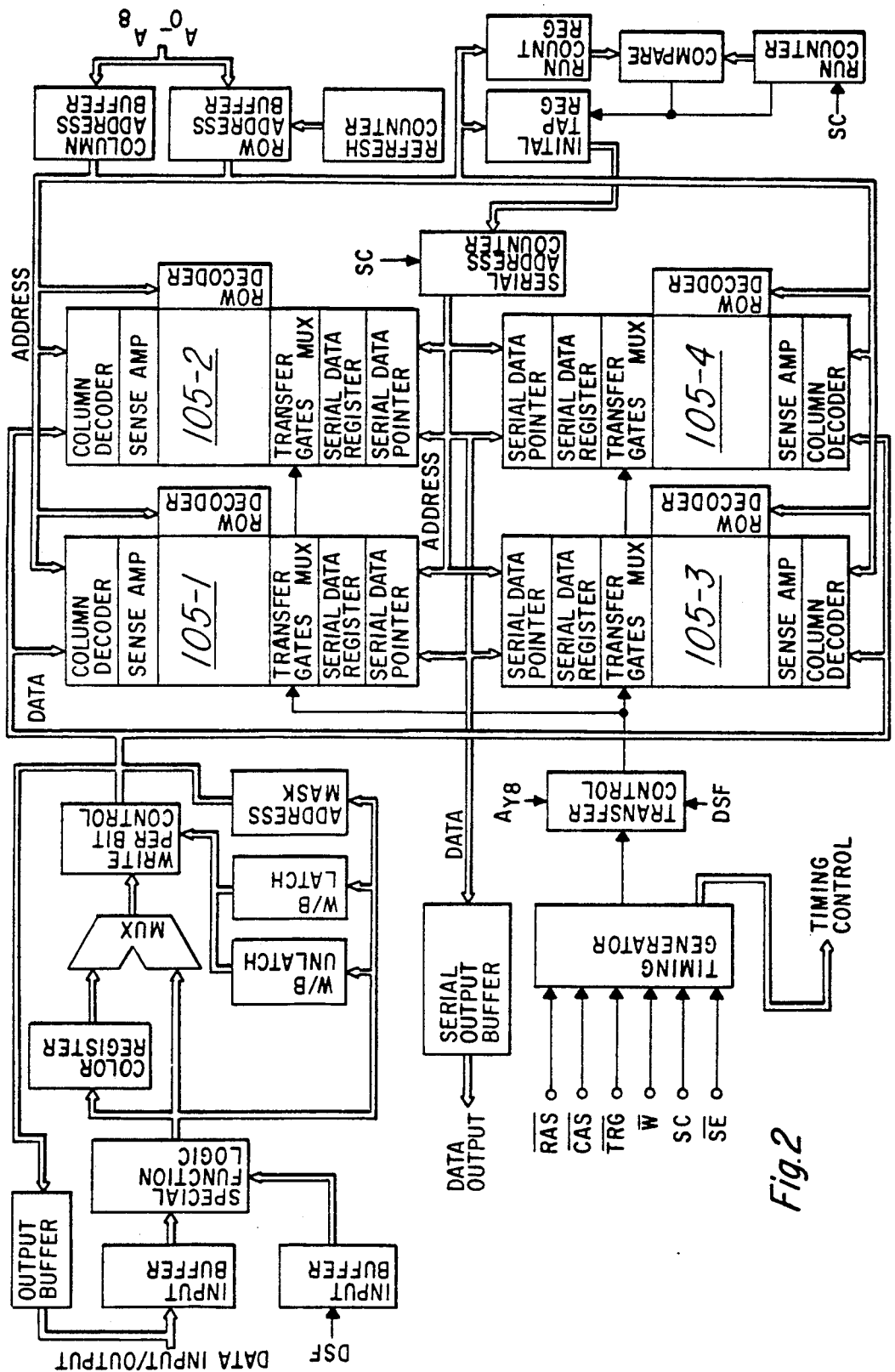
FIG. 2 is a block diagram of circuits on a video random access memory integrated circuit chip.

Referring now to FIG. 2, there is shown a block diagram layout of an integrated circuit video random access memory 105. Included within the memory 105 are four arrays of memory cells 105-1, 105-2, 105-3, 105-4. The cells are arranged in rows and columns. For random access, row and column addresses are applied to the integrated circuit by way of address leads and an address bus. For random access, row and column addresses are decoded respectively by row and column decoders. Data is written from a data bus through the column decoders and sense amplifiers to the selected cells of the memory arrays. For serial readout, the data is read from a selected row of the memory arrays, through transfer gates to the data registers. A serial address counter applies a series of serial data register addresses to the serial data pointers, or decoder. In response to those addresses, sequences of data are transmitted from the serial data registers through a data bus to a serial output buffer. From there the data proceeds to the register 107, the video palette, the digital-to-video signal converter, and to the video display, as shown in FIG. 1.

The various random access input and output circuits are replicated four times to complete the random access arrangement.

For serial output operation, a group of common circuits controls the readout operation very effectively. The group of circuits includes an initial tap register, a run count register, a run counter, a comparator, and a serial address counter which applies a series of addresses through another address bus to serial data pointers associated with each serial data register. Operation of these common circuits for serial readout are described at length hereinafter.

Figure 3:
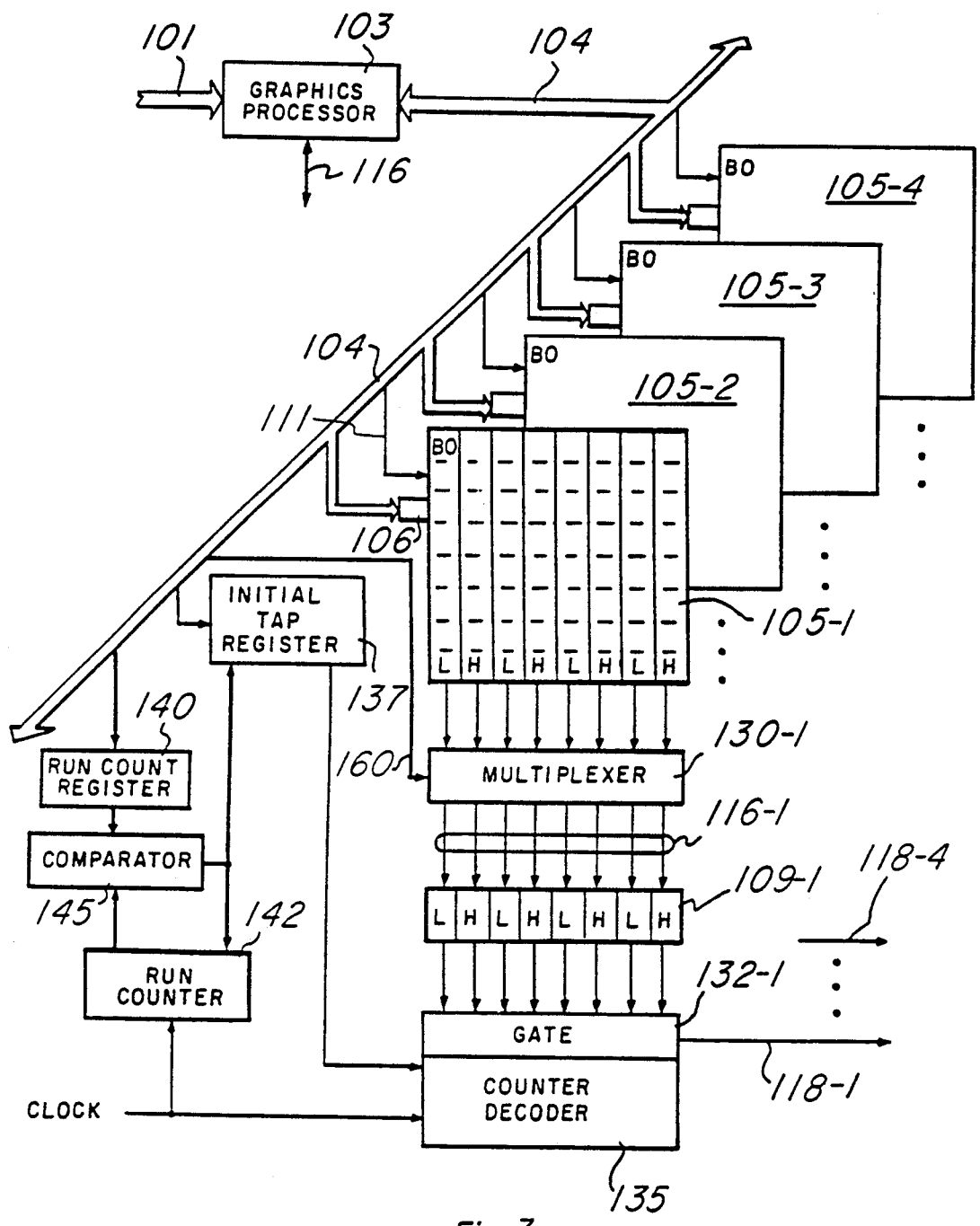
FIG. 3 is a block diagram of a random access memory system arranged with a multiplexer between a memory array and a split serial register.

Referring now to FIG. 3, there is shown a more detailed block diagram of the graphics processor 103, the video random access memory 105-1, a split register 109-1, some control circuitry, and interconnecting busses and leads. Video random access memory 105 is an exemplary memory including four memory arrays 105-1, 105-2, 105-3, and 105-4 of rows and columns of storage cells. Typically the four memory arrays are included on one semiconductor chip. Information representing a single pixel for the display includes several bits of data. There is one bit, e.g., B0, stored in each of the arrays for one pixel. All of those bits for the one pixel are stored at the same row address and the same column address so that they can be either written into or read out from the whole memory in one access operation. In any specific design, there usually are as many memory arrays as there are bits in a pixel. If more than four bits are needed per pixel, either more arrays per chip or more chips may be provided.

Although the four video random access memory arrays 105-1, 105-2, 105-3, and 105-4 are shown ganged together in FIG. 3, only one of them, 105-1, will be discussed hereinafter for purposes of simplifying both the drawing and the description without compromising any generality. It is to be understood that what is shown and said about the one memory array 105-1 and associated multiplexer 130-1, split register 109-1 and control circuits also applies to the other memory arrays and associated circuits which are ganged together from one or more semiconductor chips.

The screen of the video display 112 of FIG. 1 can be thought to be organized in either of two ways. Usually in the display, there are a large number of horizontal lines each including a large number of pixels. Another often used, but different, scheme divides the display into a number of tiles. Each tile includes some number of pixels in a contiguous area of the display. The tile areas for a display are uniform in size and therefore include some number of pixels across and some number of pixels in height. For purposes of subsequent discussion, the number of pixels across a tile equals the number of columns in a section of the video random access memory array 105-1 and the number of storage elements in a section of the split register 109-1. The split register 109-1 may be either a shift register or a serial register. Hereinafter the split register will be described as split serial register 109-1. Information in one line across a tile is considered to be a segment of the tile. Since there is only one bit per pixel in the memory array 105-1, the number of bits in a segment of the tile in array 105-1 equals the number of columns used in the sections of the memory array and the number of storage elements used in the sections of the split serial register 109-1. The number of pixels in height equals the number of lines in the tile. For a subsequent illustrative example, a tile is thirty-two pixels across and eight pixels high in the display depicted in FIG. 12, to be discussed subsequently.

The video random access memory array 105-1 is arranged so that the data, representing a tile of the display, is stored as sequential segments of the tile in a single row of the memory array 105-1. An entire tile of data is stored in the single row of the memory array 105-1. Row and column address information, together with the desired display, or pixel information, is generated by the graphics processor 103.

For random access writing, the addresses are applied through the bus 104 to an address register 106 for accessing the identified row and column storage locations in the random access memory array 105-1. The display data, to be stored at each address, also is applied through the bus 104 and a lead 111 to the random access memory array 105-1. When the graphics processor develops the random access address and display data for any tile, that data, in a departure from the prior art, is transmitted through bus 104 and is written into the random access memory 105-1 by making a single row access and thereafter accessing sequentially selected columns where data is to be stored. This enables a random access write-in operation to write in during a single row access as much as a whole tile of data. Since the accessing of a row operation takes approximately twice as long as accessing a column, considerable operational time is saved by making the single row access and performing the several column accesses while the row access remains effective.

The memory array 105-1 and the split serial register 109-1 are each divided by address into a low part and a high part. Such divisions greatly facilitate readout from the memory array 105-1 to the video display 112 of FIG. 1. Readout from the memory array 105-1 occurs sequentially by line of the display. As the raster scans a line of the display, the appropriate data for each pixel in the sequence is applied to the beam for projection on the display screen. The graphics processor 103 determines the order for addressing the storage cells of the memory array 105-1, the selection made by the multiplexer 130-1, and the order for reading data from the storage elements of the split serial register 109-1 to achieve the desired output sequence of information being forwarded to the video display 112.

Rows of the memory are addressed by part rows, e.g., low address half rows and high address half rows. Under control of the graphics processor 103, the multiplier 130-1 determines whether the data read out of either the low-half or the high-half of the memory array is transmitted by bit line to either the low-half or the high-half addresses of the split serial register 109-1. Once the data is stored in the split serial register 109-1, one or more bits of data or segments of tiles can be transmitted from the split serial register 109-1 out to the video display 112.

Additional control circuitry, which is common to the several memory arrays, is provided for determining the specific portion of data to be transmitted from the split serial register 109-1. The data from the split serial register 109-1 can be read out from a separate tap at each storage element. Conceptually, the taps are represented by a gate circuit 132 which receives a separate output from each storage element of the split serial register 109-1. A counter decoder 135 determines which one of the split serial register storage element outputs is transmitted to the video display 112 during any time slot determined by a readout clock signal CLOCK.

Since the initial pixel data to be transmitted may be in any split serial register 109-1 location, the graphics processor 103 loads the address of that initial pixel data into an initial tap, or start point, register 137. Upon receipt of a reset signal from a comparator 145, the initial tap register 137 loads the initial pixel data address into the counter decoder 135 for enabling the gate circuit 132 to transmit the data from the correct split serial register storage element. Loading of the initial pixel data address may be in parallel to the counter decoder 135.

Data read out thereafter generally proceeds sequentially along the storage elements of the split serial register 109-1, however, unlike the prior art, it does not necessarily proceed continuously. We have found that in some circumstances, it is advantageous to read data from only a portion of one half of the split serial register 109-1. One such circumstance arises when the display system is tile oriented and the data representing a tile is stored along a single row of the memory array 105-1, as previously described herein. Then for efficiency, the sequential addressing for reading out the data from the split serial register 109-1 should be interrupted before the end of half the register. In a departure from the prior art, interruptions are made by the graphics processor 103 loading a number, or run count, into a run count register 140 for determining the number of sequential addresses of the split serial register 109-1 that are accessed before the interruption, i.e., before the counter decoder 135 and gate circuit 132 jump to a new initial, or start, tap address for subsequent readout. A convenient run length is equal to the number of pixels in a segment. The number in the count register 140 and a run count from a run counter 142 are compared by the comparator 145. When they do not match, the current sequence of addresses continues as the run counter is incremented by the signal CLOCK for each readout operation. When the two counts do agree, e.g., at the end of a segment, the comparator 145 produces a signal for resetting the run counter 142 and for loading the new initial tap address into the initial tap register 137. As a result, the counter decoder 135 enables the gate circuit 132 to jump to the new initial tap address of the split serial register 109-1 and thereby interrupt the sequential addressing.

It is advantageous for a tile oriented system to run through a sequence of addresses equal to the number of addresses needed for reading out all of the pixels in a segment of a tile from one half of the split serial register 109-1 and then transfer to the other half of the split serial register to read out the pixels in a segment from another tile. Since the tiles typically end before the end of a half of the register, it is advantageous to interrupt the readout operation at the end of the tile rather than at the end of half of the register. A more detailed description of this operation is to be described hereinafter in reference to FIGS. 5 through 12.

Figure 4:
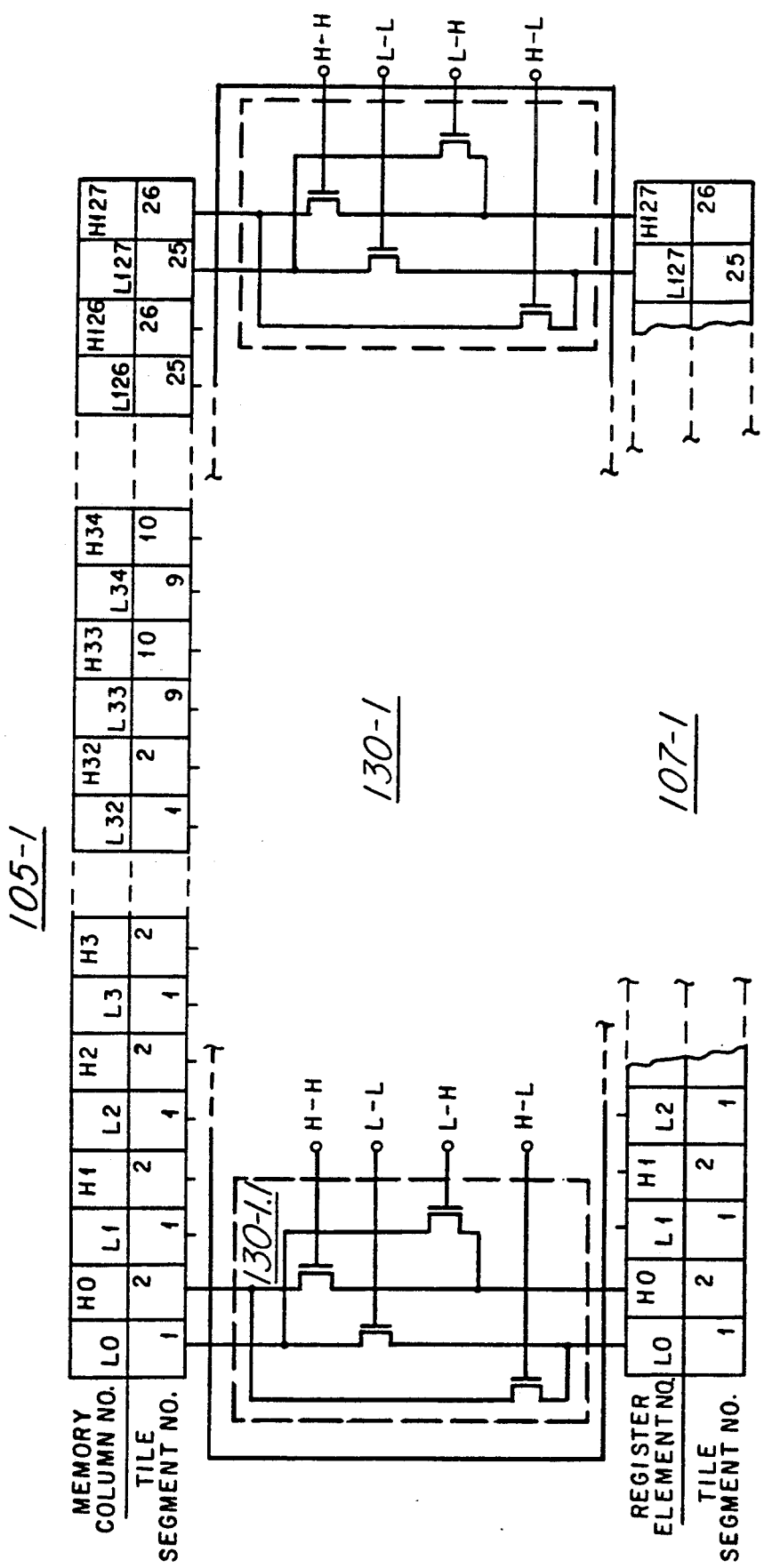
FIG. 4 is a schematic diagram of an illustrative multiplexer for coupling either a low-half or a high-half of the memory array addresses to either a low-half or a high-half of the split serial register addresses.

Referring now to FIG. 4, there is shown the physical arrangements of the storage cells and bit lines of the memory array 105-1 and of the storage elements of the associated split serial register 109-1. The memory array 105-1 and the split serial register 109-1 both are divided into parts by addresses, a low-half L of the memory array addresses including half of the storage cells and a high-half B of the memory array addresses including the remaining storage cells. The low-half designators LO . . . L127 are shown below the high-half designators HO . . . B127 so that, at a glance, the two halves will stand out from each other in FIG. 4.

In a departure from prior memory arrays, the storage cells L of the low-half addresses of the memory array 105-1 are interleaved with the storage cells H of the high-half addresses of the memory array. Similarly, in a departure from prior random access memory system arrangements, the storage elements L of the low-half addresses of the split serial register 109-1 are interleaved with the storage elements H of the high-half addresses of the split serial register 109-1.

Such interleaving of the storage cells of the two parts of the memory columns and of the storage elements of the two parts of the split serial register 109-1 provides a significant advantage when the memory array 105-1 and the split serial register 109-1 are fabricated as an integrated circuit. By interleaving, the total length and complexity of the bit lines, which are arranged for coupling the storage cells of the memory array 105-1 through the multiplexer 130-1 to the storage elements of the split serial register 109-1, are substantially reduced with respect to the bit line layout, which otherwise is required when the lover and upper halves of the memory array 105-1 and split serial register 109-1 are divided by whole physical sections rather than by the interleaving of the columns and register elements, as shown in FIG. 4.

FIG. 4 additionally illustrates a schematic for a section 130-1.1 of the multiplexer 130-1 which can be used for transferring data from one cell in either half of the addresses of the memory array 105-1 to a storage element in either half of the addresses of the split serial register 109-1. The illustrated section 130-1.1 of the multiplexer 130-1 couples one column address of the high-half or one Column address of the low-half of the memory array 105-1 to associated high or low half storage lements of the split serial register 109-1. The complete multiplexer 130-1 uses one of such multiplexer sections 130-1.1 for every pair of bit lines.

Referring now to FIG. 5, there is shown a truth table that describes the logical operation of the section 130-1.1 of the multiplexer 130-1 shown in FIG. 4. A one-out-of-four code, received from the graphics processor by way of a path 160 of FIG. 3, is applied to the control terminals H—H, L—L, L-H and H-L of the illustrative switching devices. In response to the one-out-of-four code, one gate of the multiplexer section 130-1.1 is enabled. The other three gates remain disabled. Input control signals are designated low-half-to-low-half, L—L; low-half-to-high-half, L-H; high-half-to-low-half, H-L; and high-half-to-high-half, H—H. Inputs are from the high-half H or low-half L of the memory array, and outputs go to the high-half B or low-half L of the split serial register.

It is noted that the multiplexer operations represented by the truth table of FIG. 5 is not dependent upon the interleaving of the storage elements in the memory array or in the split serial register, as shown in FIG. 4. The described multiplexer operations may be used for coupling the column addresses of other arrangements of split memory arrays to the addresses of the split serial register.

The graphics processor 103 of FIGS. 1 and 3 generates all of the information for the graphic display. Each bit of the data can be generated at any time and in any order. The processor 103 knows which bit is being generated at any time and where that bit is preassigned, or mapped, for storage in the random access memory 105. When randomly writing the bits into the random access memory 105, the order of writing the bits is unimportant except for efficiency considerations, but each bit must be stored in a storage element at its own preassigned, or bit mapped, location in the random access memory.

For efficient, speedy random writing of data into the memory array, it is effective to access for writing by tiles rather than by individual pixels. All changed information for one or more tiles is generated and written quickly. All stored information for other unchanged tiles need only be refreshed, not written again. By so writing only into tiles where information has changed, all of the writing can be accomplished very efficiently.

Referring now to FIG. 6, there is shown a Cartesian coordinate map representing the storage locations in the random access memory array 105-1 presented in FIGS. 3 and 4. It is noted that the low-half and the high-half of the array are divided in the center rather than by interleaving the columns. This array is shown divided in the center for the purpose of illustrating the concept by a simplified drawing. Our preference in practice, however, is to interleave memory storage elements and the column leads by address, as shown in FIG. 4. The interleaved arrangement can handle the high-half, low-half transfer operations in accordance with the subsequent discussion just as well as the illustrated random access memory array 105-1 of FIG. 6.

The grid of FIG. 6 is an 8×8 array of squares, each square of which represents the information to be presented as an eighth of a tile to be presented on the graphic display. In FIG. 6 and subsequently in FIGS. 7-12, squares represent segments of data. Each segment is numbered so that the reader can follow numerically identified segments from storage in the memory array through the multiplexer and split serial register to the display, as subsequently discussed. The numbers in the squares identify the information as segments of the tiles. Each segment of data is stored in a section of a row of the memory. Data represented by each one of the numbered squares, or segments, includes thirty-two bits of data (i.e., 32 columns×1 row) which are stored as shown in the memory array 105-1. A tile of the display image is represented by all of the bits stored in the memory cells along a single row of the random access memory array 105-1, e.g., row 1. It was noted previously that relating to the display of FIG. 12, the tiles are thirty-two bits wide by eight bits high and are oriented in vertical columns in the display, as discussed subsequently with respect to FIG. 12.

Recall that data can be written into the storage cells of the random access memory array 105-1 in any sequential order but each bit must be stored in its preassigned location. For the purpose of enhancing the overall speed of operation of the display system, the graphics processor creates the information for the display image by tiles and stores that information into the memory array. In FIG. 6, all of the data included in each row of the memory array is equivalent to a full tile. As the graphics processor 103 creates all of the data making up a single tile, the graphics processor only accesses a single selected row in the memory array 105-1 one time. While that selected rom is accessed, the columns are accessed one at a time until all of the new data, related to the one tile, is stored in the accessed row of the random access memory. Because the graphics processor 103 writes, or stores, all of the data contained in one tile while accessing only one row of the memory array, considerable system operating efficiency is achieved. Each row access generally takes as much as twice the time needed for each column access. For efficient operation, the worst case occurs when only a single column is accessed for each row access. Our arrangement can achieve as much as a seventy percent reduction in operating time with respect to the worst case for writing randomly into the random access memory.

After a complete display screen of data is stored in the random access memory 105 of FIG. 1, the system can commence reading that data from the random access memory for transfer to the split serial register 109-1, the data register 107 and on to the video display 112. As shown in FIG. 6, data is stored in the memory by segment. The video display uses a well-known raster scanning technique for presenting the graphic information on a display screen or cathode ray tube. Meanwhile, the graphics processor 103 scans the random access memory 105 for transferring data to the display. Data from the memory array is transferred through the multiplexer, the split serial register, the data register 107, and the color palette, and is coordinated with the raster beam as it sweeps across one horizontal line after another projecting the graphics information onto the screen at predetermined locations. The sequential order of readout of data from the memory array is fixed by the hardware and firmware of the graphics display system. The first data for display is segment 1, then segment 2, etc., until finally segment 64. While the data from one half row of the addresses of the data register 107 are being read out to the display 112, data from another half row of addresses can be transferred from the memory array 105 to the idle half of the split serial register 109-1. The information sent from the split serial register may be -and often is- less than an entire half register for every half register of data transferred thereto from the memory.

From the split serial register, the data is sent to the video palette by way of the data register 107 of FIG. 1. Data register 107 is arranged to receive in parallel, the sequential data streams from each of the arrays 105-1, 105-2, 105-3, and 105-4 by way of the output leads 118-1, 118-2, 118-3, and 118-4 of FIG. 3. In operation, the data register 107 takes in the plural parallel streams of input data, and shifts them out in one interleaved sequence. All of the bits for each pixel are grouped together in the output stream of data. Thus all of the data describing each pixel is applied to the video palette at once.

The video palette translates the pixel data into the desired form for application to the digital to video converter. From the digital to video converter, the video signals are applied to the display. At the finish of each line of the screen, the raster retraces, or returns, to the beginning side of the screen, typically, one or more lines lower. During retrace, graphic information is blanked from the beam. Once the retrace is completed, the raster commences sweeping across another line of the screen and projects the graphic display information. Because the raster beam sweeps across the entire screen and then retraces, the data read from the memory array must be presented to the beam modulator of the video display 112 in the proper sequential order for each complete sweep across the screen.

The operation of reading data from the memory and transferring it through the multiplexer, the serial shift register and the gate to the data register may be better understood by carefully reading the following description of FIGS. 7-13.

Referring now to FIG. 7, there is shown a table representing the operation of sequentially reading the stored data, as presented in FIG. 7, from the random access memory of FIGS. 3 and 4. In FIG. 7, the leftmost column shows the time slots for reading segments of data from the memory array 105-1. The column labeled the LOW HALF of the register shows which groups of bits, or parts of tiles, are read out of the memory array and into the low-half of the split serial register 107-1 of FIG. 4 in preparation for transfer of selected segments to the video display 112 during odd numbered time slots of the readout operation. Likewise, the column labeled HIGH HALF of the register shows the groups of bits that are read out of the memory array and into the high-half of the addresses of the split serial register 107-1 in preparation for transfer of other selected segments to the display during even numbered time slots. The column labeled MULTIPLEXER presents an indication of the control signal information for operating the multiplexer 130-1 for the transfer of data into the split serial register 107-1 before it is sent to the video display. In the columns labeled RAM and REGISTER, the letters designate, respectively, the low-half L or high-half R of the addresses of the memory array 105-1 and the split serial register 107-1 and thus designate the multiplexer control signalling used in FIG. 4.

Figure 8:
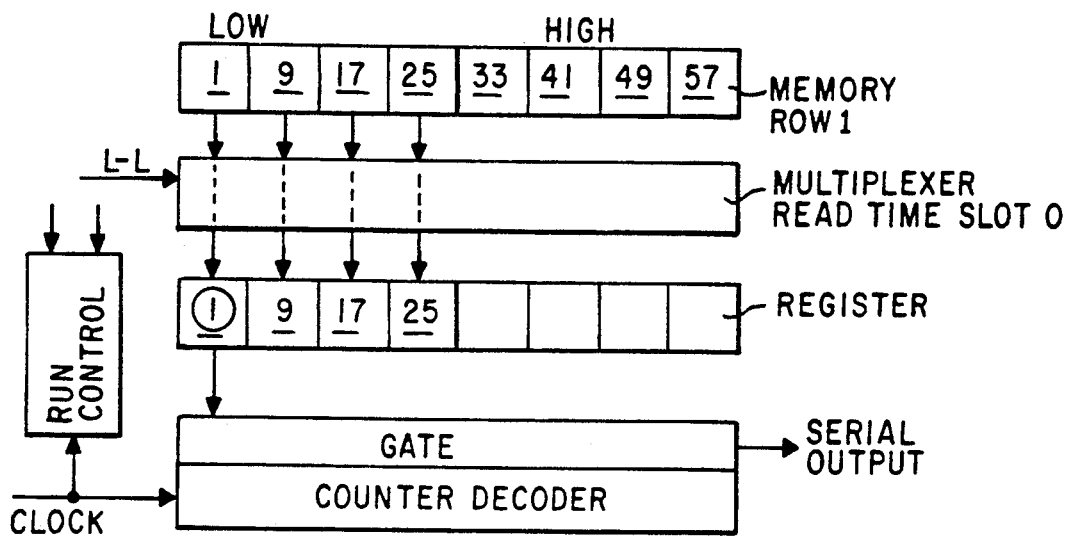
FIGS. 8 through 11 are block diagrams of a selected row of memory, a multiplexer, a split serial register and control circuits in four different operating conditions.
Figure 9:
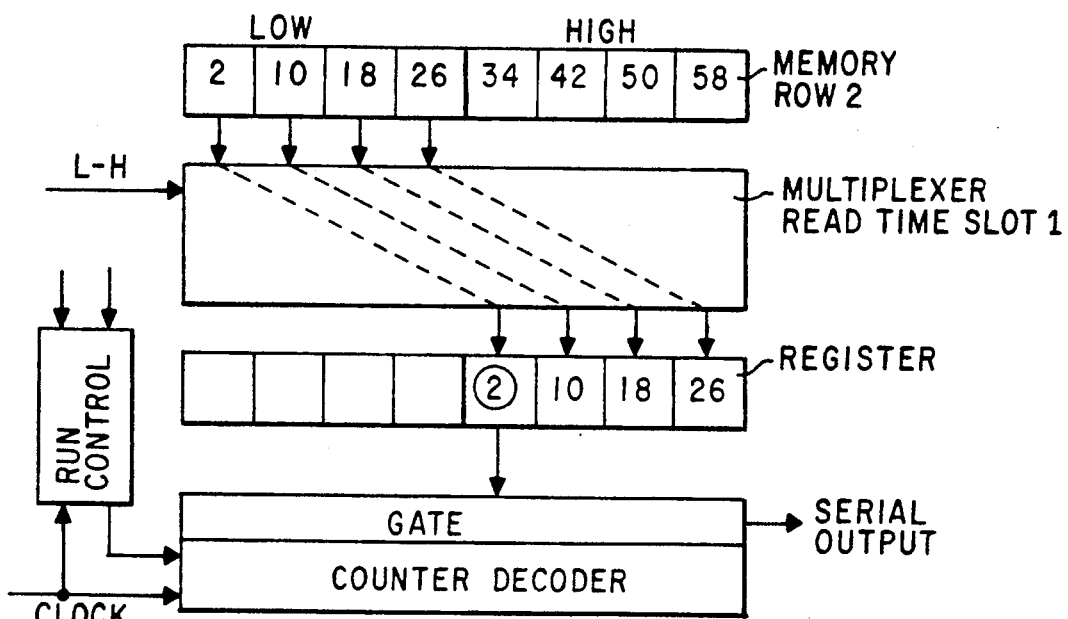

As shown in FIGS. 7 and 8, during read time slot O, data from the low-half L of the first row of the memory array 105-1 is read out through the multiplexer to the low-half L of the split serial register 107-1. The multiplexer 130-1 is set for a low-half L to low-half L transfer (control signal L—L). There are thirty-two bits in each of the segments, or squares, 1, 9, 17 and 25. Those numbers are underscored to indicate that they are segments of tile 1. While that data is residing in the split serial register 107-1 during time slot 1, only the thirty-two bits representing segment 1 are forwarded to the video display 112. The numeral 1, representing the tile segment 1, is enclosed in a circle to indicate that segment is to be forwarded to the video display. The initial tap address, to be stored in the initial tap register 137, is the address of the first bit of segment 1. Thirty-two is stored into the run count register 140 so that the sequential read is interrupted when 32 bits are read out from the split serial register. Segments 9, 17 and 25 are not forwarded during time slot 1. Refer now to FIGS. 6 and 8 for the next step of the sequential readout. While the segments 1, 9, 17, and 25 are residing in the low-half of the register, data from the low-half L of the second row of the memory array 105-1 is transferred through the multiplexer to the high-half R of the split serial register 107-1. The multiplexer 130-1 is set for a low-half L to high-half H transfer (control signal L-K). Bits of segments 2, 10, 18 and 26 are transferred into the high-half of the split serial register 107-1. During time slot 2, the 32 bits representing the segment 2 are forwarded to the display device. This is accomplished by storing the appropriate start address and run count while the segments are being transferred into the split serial register. The number 2 is encircled to indicate that the segment 2 is so forwarded to the display in sequence following segment 1. In FIGS. 7-11 for each of the time slots only one segment number is encircled to indicate which tile segment is forwarded in the sequence going to the display. An appropriate start address and run count are stored and used for each time slot.

Figure 10:
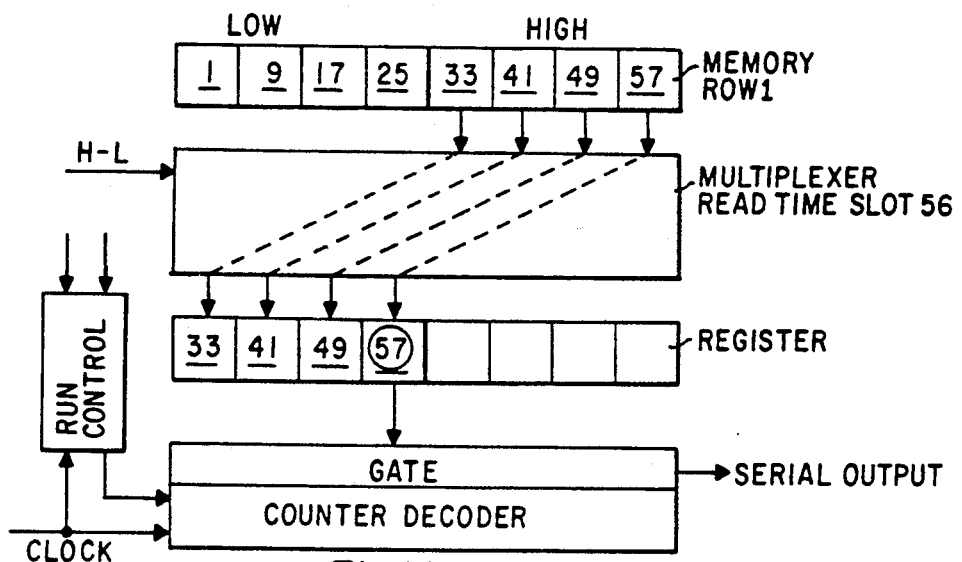
Figure 11:
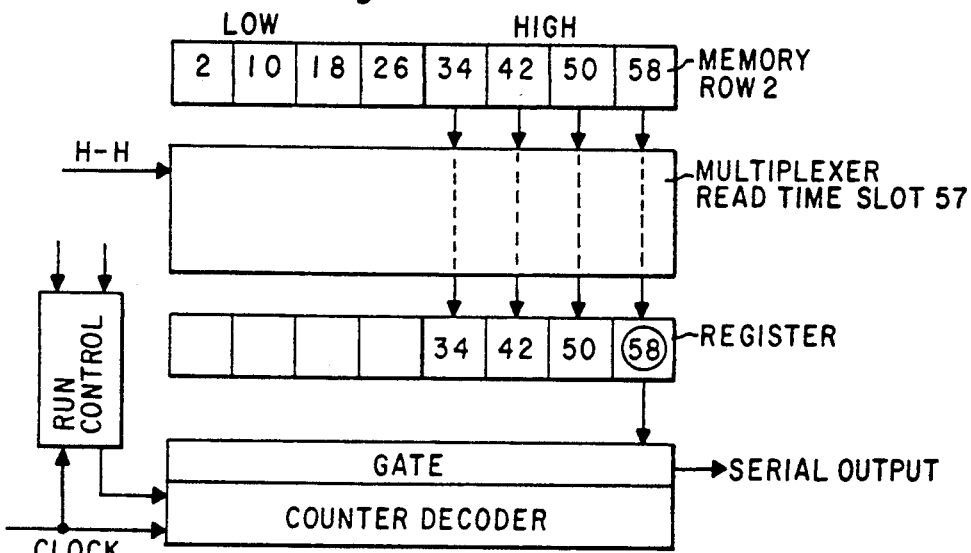

FIGS. 10 and 11 show additional examples of the data from rows 1 and 2 of the memory being transferred through the multiplexer to the split serial register for sending segments 57 and 58 to the display.

Referring now to FIG. 8, there is shown a time line for the sequence of tile segments being forwarded out of the split serial register 107-1 of FIG. 3 to the display. By forwarding the data stored in sequential rows of the low-half of the random access memory alternately to the low-half and the high-half of the split serial register, followed similarly by data stored in the high half of the random access memory, the tile segments can be transmitted to the video display 112 of FIG. 1 in sequential order 1, 2, 3, . . . 64, as shown in FIG. 12.

Referring now to FIG. 13, there is shown a graphic representation of the stored data, from the memory array 105-1, as an image created by the tile segment information presented in raster scan sequence on the video display 112. The numbered segments of the data are presented to the video display in sequential order 1, 2, . . . 64. Each scan of the raster includes eight segments of the data, one segment for each of eight tiles per scan. There are eight tiles in a complete screen of the display. Each tile is in a separate column on the screen and may be identified by the number in the top row of its column. Thus the tiles are numbered 1, 2 . . . 8. It is noted that all of the data for each tile of the display screen is mapped from a different row of the memory array 105 of FIG. 6.

Figure 14:
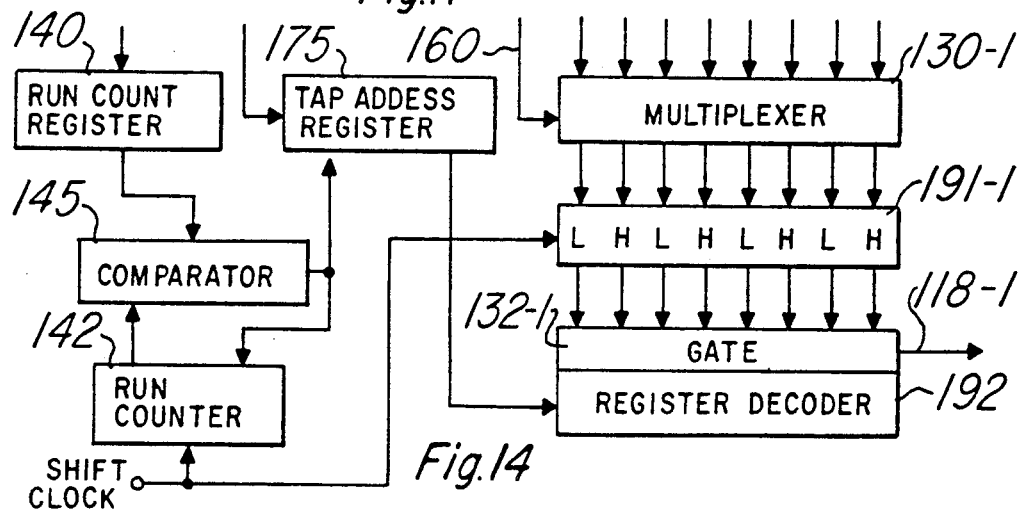
FIG. 14 is a block diagram of a random access memory system arranged with a multiplexer between a memory array and a split shift register.

FIG. 14 shows an alternative arrangement of the serial readout circuits and of the serial readout control circuits for a system using a split shift register. It is noted that features which are the same as the features of FIG. 3 are designated with the same numerical identifier. Other numerical identifiers are used with respect to different features.

When data is to be read out serially from the array of memory cells, control signals on the leads 160 cause the data from either the low-half or the high-half of the memory to be transferred to either the low-half or the high-half of the split shift register. The split shift register is arranged at every stage with a tap for outputting data. A tap address register 175 is loaded with the address of the tap from which the first bit of a data sequence and subsequent data is to be outputted. When a signal is applied from the comparator 145 to the tap address register 175, the tap address is loaded into the register decoder 192. The register decoder 192 stores the tap address for the duration of the current serial readout operation. A decoded signal is applied to the gate 132-1 to identify and enable the selected tap for reading out data from the associated shift register stage.

A shift clock signal, applied to the split shift register 191-1 and the run counter 142, shifts data along the stages of the shift register 191-1 and increments the count in the run counter 142. During each clock cycle, a new bit of data is stored in the shift register stage associated with the selected tap. That now bit is read out through the gate 132-1 and the lead 118-1 for transmission to the video display, not shown.

The comparator 145 continuously compares the count in the run counter 142 with the run count value stored in the run count register 140. Whenever they do not match, the comparator produces a low output signal. When they match, however, the comparator produces a high output signal. This high output signal is the signal which resets the run counter 142 to zero and enables the tap address register 175 to send a new tap address to the register decoder 192.

The foregoing description presents the arrangement and operation of an illustrative example of the invention. This exemplary arrangement and other arrangements, made obvious in view thereof, are considered to be within the scope of the appended claims.

I claim:

1. A video random access memory comprising:
   first and second portions of an array of memory cells arranged in rows and columns, the first and second portions having different groups of column addresses;
   first and second pluralities of column leads, each column lead being arranged for coupling to the memory cells in a different column of the array, the first and second pluralities, respectively, being associated with the memory cells of the first and second portions;
   first and second parts of a split register, each part of the split register including a plurality of storage elements; and
   a multiplexer for selectively, by the different groups of column addresses, coupling either the first or the second portion of the array of memory cells by way of the associated plurality of column leads to the storage elements of either the first part or the second part of the split register.

2. A video random access memory, in accordance with claim 1, wherein:
   the split register is a split serial register.

3. A video random access memory, in accordance with claim 1, wherein:
   the split register is a split shift register.

4. A video random access memory comprising:
   first and second portions of an array of memory cells arranged in rows and columns, the first and second portions of memory cells being in different groups of column addresses;
   first and second pluralities of column leads, each column lead being arranged for coupling to the memory cells in a different column of the array, the first and second pluralities, respectively, being associated with the memory cells of the first and second portions;
   first and second parts of a data register, each part of the data register including a plurality of storage elements; and
   a selection switch for selectively, by the different groups of column addresses, coupling the first portion of the array of memory cells by way of the first plurality of column leads either to the first part of the data register or to the second part of the data register and for selectively, by the different groups of column addresses, coupling the second portion of the array of memory cells by way of the second plurality of column leads either to the first part of the data register or the second part of the data register.

5. A video random access memory, in accordance with claim 4, wherein:
   the data register is a split serial register.

6. A video random access memory, in accordance with claim 4, wherein:
   the data register is a split shift register.

7. A semiconductor memory device comprising:
   first and second portions of column addresses of an array of memory cells arranged in rows and columns wherein the columns of the first and second portions are interleaved with each other by column address;
   first and second pluralities of column leads, each column lead arranged to be coupled to the memory cells in a different column of the array;
   first and second parts of a data register, each part of the data register including a plurality of storage elements, individual storage elements of the first part of the data register being interleaved by address with individual storage elements of the second part of the data register; and
   a multiplexer for selectively coupling individual rows of either the first or the second portion of the column addresses of the array of memory cells by way of the associated plurality of column leads to either the first or the second part of the data register.

8. A semiconductor memory device, in accordance with claim 7, wherein:
   the data register is a split serial register.

9. A semiconductor memory device, in accordance with claim 7, wherein:
   the data register is a split shift register.

10. A semiconductor memory device comprising:
    a memory cell matrix including memory cells arranged in rows and columns, the memory cell matrix having a high-half of the column addresses and a low-half of the column addresses;
    a row select circuit for the memory cell matrix;
    a column select circuit for the memory cell matrix;
    a sense amplifier and a bit line connected with each column of the memory cell matrix;
    a serial register including storage elements, the serial register having high-half addresses and low-half addresses of the storage elements; and a multiplexer for selectively interconnecting the high-half of the column addresses with either the high-half addresses or the low-half addresses of the storage elements and for selectively interconnecting the low-half of the column addresses with either the high-half addresses or the low-half addresses of the storage elements.

* * * * *